United States Patent
Ando

(10) Patent No.: US 6,885,234 B2
(45) Date of Patent: Apr. 26, 2005

(54) RESISTANCE LOAD SOURCE FOLLOWER CIRCUIT

(76) Inventor: Yoshiyuki Ando, Nishi 3-2-62 Kunitachi-shi, Tokyo (JP), 186-0005

( * ) Notice: Subject to any disclaimer, the term of this patent is extended or adjusted under 35 U.S.C. 154(b) by 0 days.

(21) Appl. No.: 10/709,481

(22) Filed: May 8, 2004

(65) Prior Publication Data

US 2005/0007182 A1 Jan. 13, 2005

Related U.S. Application Data

(63) Continuation-in-part of application No. 10/064,491, filed on Jul. 22, 2002, now abandoned.

(51) Int. Cl.[7] .............................. H03K 3/01; G05F 3/02
(52) U.S. Cl. ...................................... 327/534; 327/544
(58) Field of Search .................................. 327/534, 535, 327/537, 538, 543, 544; 326/35, 36

(56) References Cited

U.S. PATENT DOCUMENTS 6,191,615 B1 * 2/2001 Koga ........................... 326/81
2004/0070441 A1 * 4/2004 Bringivijayaraghavan .. 327/534

* cited by examiner

Primary Examiner—Tuan T. Lam
(74) Attorney, Agent, or Firm—Richard D. Fuerle

(57) ABSTRACT

A complementary source follower circuit has an N-channel type transistor and a P-channel transistor. The threshold voltage of each transistor is independently controlled by a back bias voltage control circuit so that the input voltage and the output voltage relationship can be made linear without the use of an additional circuit such as a level shifting circuit. Also, power consumption can be reduced when the circuit is in standby mode by using the back bias voltage control circuit to achieve non-linearity. A back bias voltage control circuit can also be used to control the threshold voltage of a transistor in series with a resistance load to reduce power usage.

19 Claims, 22 Drawing Sheets

(75) Inventors:

RESISTANCE LOAD SOURCE FOLLOWER CIRCUIT

CROSS REFERENCE TO RELATED APPLICATIONS

This application is a continuation-in-part of application Ser. No. 10/064,491, filed Jul. 22, 2002, and now abandoned.

BACKGROUND OF INVENTION

This invention relates to a semiconductor circuit on a large scale integrated circuit (LSI). In particular, it relates to a complementary source follower circuit of a MOS (metal oxide semiconductor) LSI that is suitable for an output buffer of an analog circuit.

FIG. 1 shows a conventional CMOS (complementary MOS) drain follower circuit. In FIG. 1, there are two transistors, a P-channel MOSFET (metal oxide semiconductor field effect transistor) and an N-channel MOSFET. Each transistor has a source (S), a drain (D), a gate (G), and a body (B). This circuit can be used to invert signals, i.e., to convert a logical "0" into a logical "1" and a logical "1" into a logical "0," where a logical "0" is represented by the voltage Vss and a logical "1" is represented by the voltage Vcc. The logical "1" or "0" signal is supplied to "IN" and the inverted logical "0" or "1" signal is sent to "OUT." The voltages Vss and Vcc are kept constant during the operation of the circuit. Each of the transistors should be "off" when the other transistor is "on" but there is some overlap when both transistors will be "on," resulting in a "DC path" with a current flow, Id, from Vcc to Vss. This current flow is wasted power.

FIG. 2 illustrates the relationship between the voltage at IN in FIG. 1 (Vin along the horizontal axis) and the voltage at OUT in FIG. 1 (Vout along the right vertical axis) and shows that as Vin approaches the voltage Vcc, Vout approaches the voltage Vss and as Vin approaches the voltage Vss, Vout approaches the voltage Vcc. The left vertical axis gives the current Id (dotted curve) that flows as Vin increases along the horizontal axis from Vss to Vcc and shows that when Vin is about midway between Vss and Vcc there is a current flow Id, which is lost power.

The circuit of FIG. 1 is useful for processing digital signals because digital signals consist of a logical 0 or a logical 1, and intermediate levels where power is lost occur only during transitions between them. However, as circuits shrink, it is becoming possible to perform both digital and analog functions on a single chip, which is especially desirable for wireless and mobile applications.

FIG. 3 shows an example of an analog signal. This signal consists of many intermediate voltage levels. When an analog signal is inputted to conventional CMOS circuit, such as that of FIG. 1, the current Id flows almost constantly because the voltage is at intermediate levels so much of the time.

FIG. 4 shows a complementary source follower circuit similar to the complementary drain follower circuit of FIG. 1, where the sources, rather than the drains, are connected to the "OUT" voltage. FIG. 5 is similar to FIG. 2 but shows (horizontal axis and right vertical axis) that as the INPUT voltage in FIG. 4 increases from Vss to Vcc the OUTPUT voltage Vout increases from Vss to Vcc. FIG. 5 also shows (horizontal axis and left vertical axis) that there is a small current loss Id (dotted curve) at a voltage intermediate between Vss and Vcc. The level of current Id depends on the threshold voltage conditions. When the voltage applied to the transistors does not exceed their threshold voltages, both transistors are in an off condition and there is no "Id" current flow. For that reason, source follower circuits are attractive for merged digital-analog systems.

FIG. 6 shows a source follower circuit having an active load. But in the circuit of FIG. 6, when the transistor is "on" a current steadily flows between Vcc and Vss, which increases power consumption. Also, the driving power is low because the current is shared between both the active load and the output load.

In order to reduce the power consumption and the driving power loss, a complementary source follower circuit can be used as shown in FIG. 7. This circuit can be realized using a bulk semiconductor substrate such as a single crystal silicon N-type or P-type substrate, but for a P-type substrate the source-to-body connection of the N-channel transistor is eliminated (as in FIG. 7) and for an N-type substrate the source-to-body connection of the P-channel transistor is eliminated (not shown).

However, eliminating the source-to-body connection in FIG. 7 results in non-linearity between the output voltages of the two transistors because the characteristics of the two transistors are not symmetrical.

In U.S. Pat. No. 5,463,240, a complementary source follower circuit on a common substrate is achieved by isolating each P-channel and N-channel transistor from the common semiconductor substrate. In laid open Japanese Patent No. 2000-323720 by the instant inventor, an SOI (silicon on insulator) substrate is used and in that invention no additional mask or circuit is needed, because on an SOI substrate each transistor can be isolated from other transistors and from the substrate.

As shown in FIG. 8, the linear relationship between input voltage Vin and output voltage Vout shown in FIG. 5 is offset when both transistors are "off" at the same INPUT voltage. Non-linearity occurs because the INPUT voltage is lower than the threshold voltages of the transistors. This creates a "dead gap" at an intermediate voltage between Vss and Vcc where both transistors are "off" and the voltage at the OUTPUT node is open. This dead gap can be tolerated when the signal is digital, but it distorts an analog signal. Improvements in the linearity between the input signal and the output signal are needed in order to permit a source follower circuit to process analog signals.

The circuit shown in FIG. 9 is similar to the circuit shown in FIG. 4 except that a voltage VthN is added to the input voltage Vin going to the N-channel MOSFET and a voltage VthP is subtracted from the input voltage Vin going to the P-channel MOSFET. As shown in FIG. 10, these shifts in the two input voltages shift the voltage output Vout to the dotted line, thereby eliminating the dead gap.

In U.S. Pat. No. 6,333,623, a source follower circuit is used as a voltage regulator because a source follower circuit has low output impedance. In this patent, level shift circuits are also disclosed. In this patent, a level shift circuit is applied to the input node (IN) of the complementary source follower circuit to solve the dead gap problem. Also, a source follower circuit is used as a voltage regulator because a source follower circuit has low output impedance. In this patent, level shift circuits are also disclosed.

In the above patents, in order to realize complementary source follower circuits additional manufacturing processes

SUMMARY OF INVENTION

An object of the present invention is to provide a high performance, area-efficient complementary source follower circuit that can be fabricated by conventional CMOS technology, without the need for special manufacturing processes or structural modifications.

Another object of the present invention is to avoid the use of additional circuits and the placing of limitations on the use of the circuit and instead to employ standard devices available in high performance CMOS logic technology.

Pursuant to these and other objectives, one embodiment of the present invention comprises a complementary source follower circuit having P-channel and N-channel MOSFETs, where the threshold voltage of each MOSFET is independently controlled by a back bias control circuit from which control signals are sent to each of the source and body terminals. In the circuit of this invention, a drain of one MOSFET is connected to the ground level and the drain of the other MOSFET is connected to the supply voltage, both gate terminals are connected to each other as an input node, and both source terminals are connected to each other as an output terminal node. There are no signal line connections from either source or either drain to the body and there is no signal line connection from the back bias circuit to the drain.

A significant and novel feature of the present invention is that there is usually no need for an additional circuit such as a level shift circuit (though one can be used, if desired or needed), which results in less time delay. In addition, because each transistor's threshold voltage can be controlled over a wide range, the power consumption can be reduced when the circuit is in stand-by mode.

Another advantage of the present invention is that it can be used to eliminate of the dead gap.

In another embodiment of this invention, an SOI substrate is used.

In this invention, analog and digital signal circuits can be combined on one chip without any additional manufacturing processes such as masking.

DETAILED DESCRIPTION

The present invention can be implemented using conventional MOSFET technology, and the described embodiments can be designed and fabricated in accordance with known CMOS and SOI rules and methodologies. These rules and methodologies are well-known in the art and will not be repeated for this description. SOI materials meeting this criterion are well known in the art.

Figure 1:
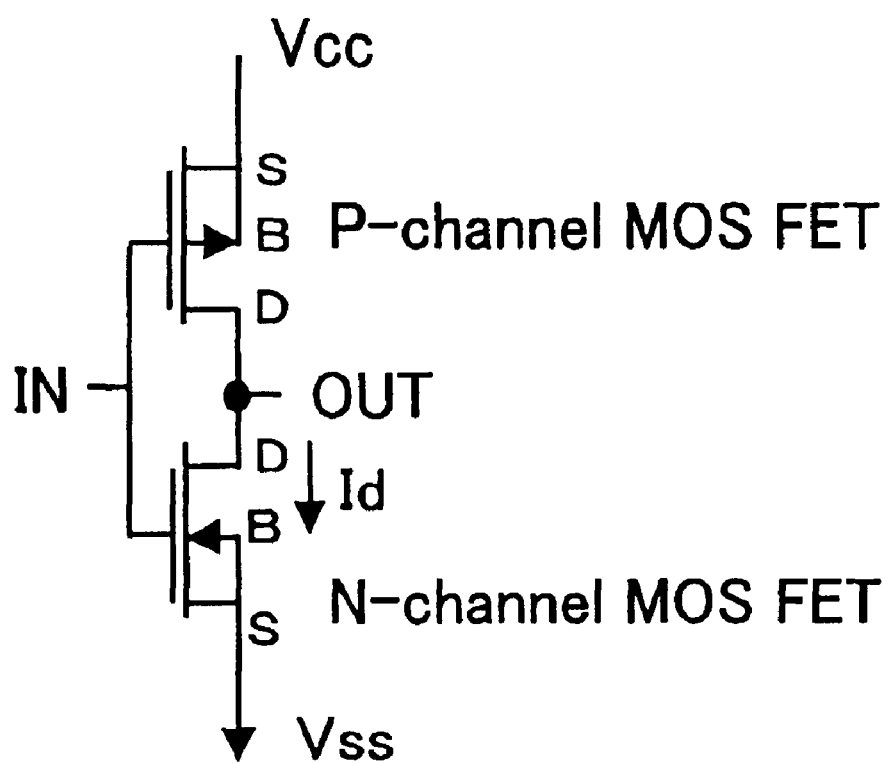
FIG. 1 shows a prior art drain follower CMOS circuit.
Figure 2:
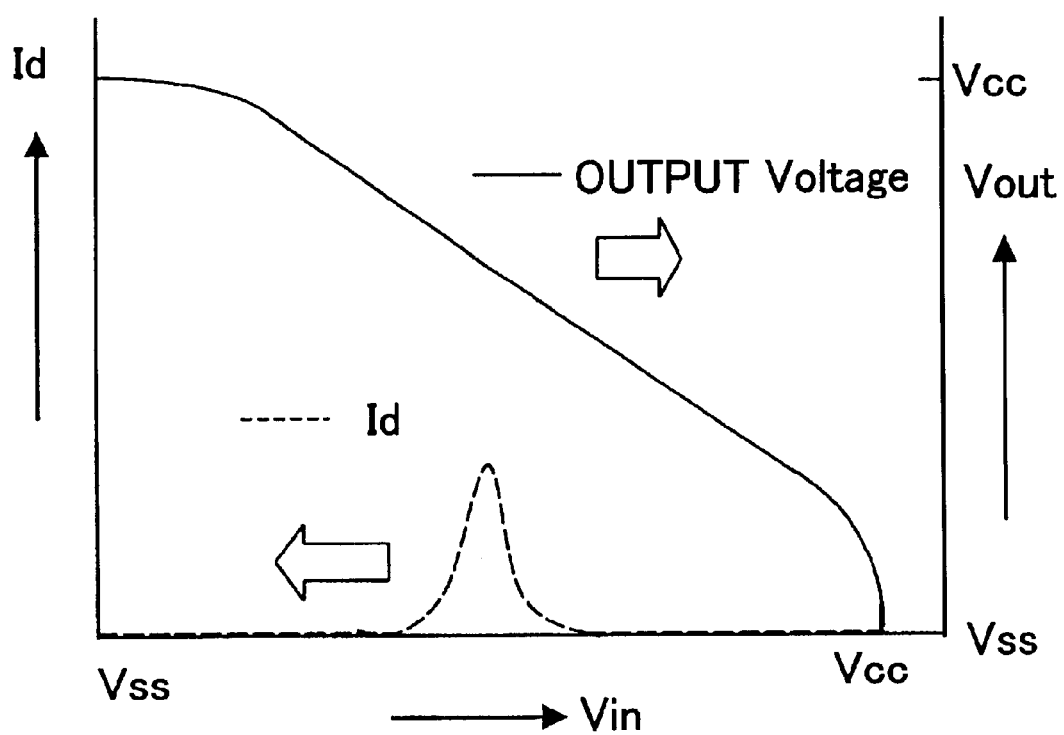
FIG. 2 is a graph illustrating the relationships between input voltage versus through current "Id" and output voltage for the circuit of FIG. 1.
Figure 3:
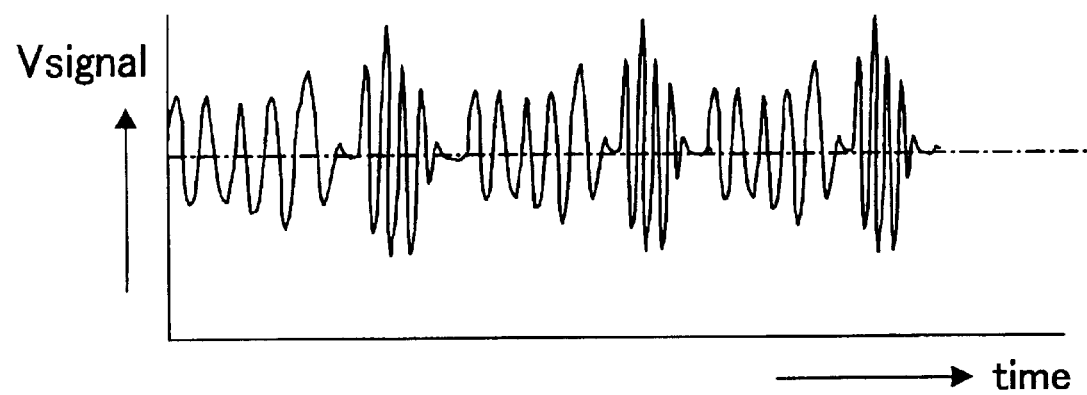
FIG. 3 is a graph illustrating a typical analog signal waveform.
Figure 4:
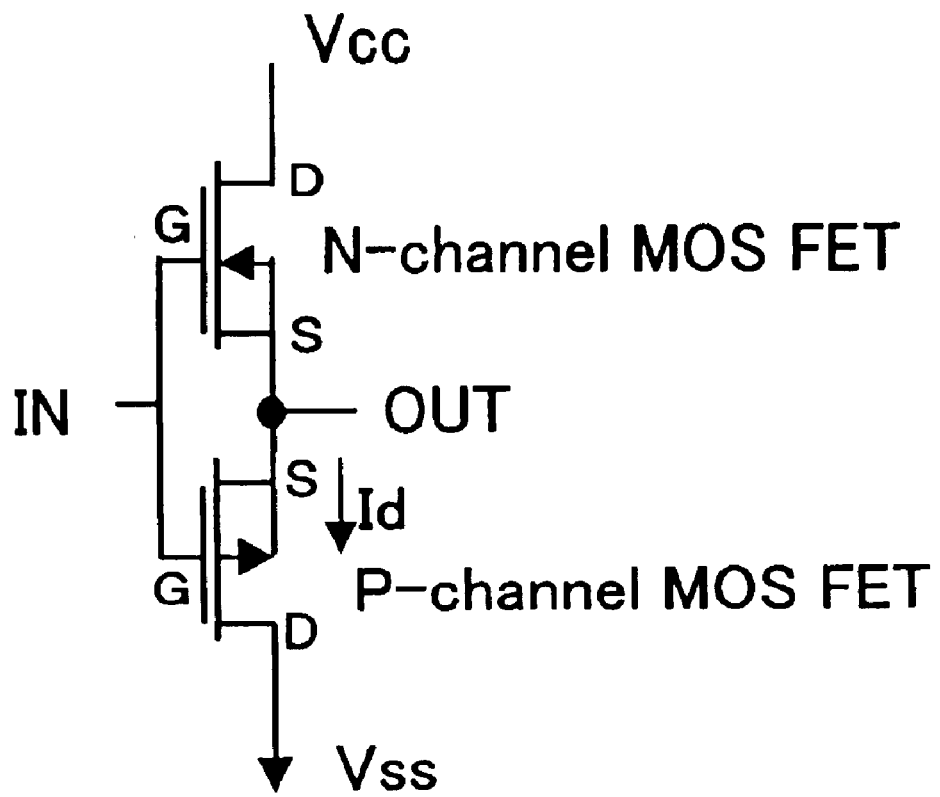
FIG. 4 shows a typical prior art source follower circuit.
Figure 5:
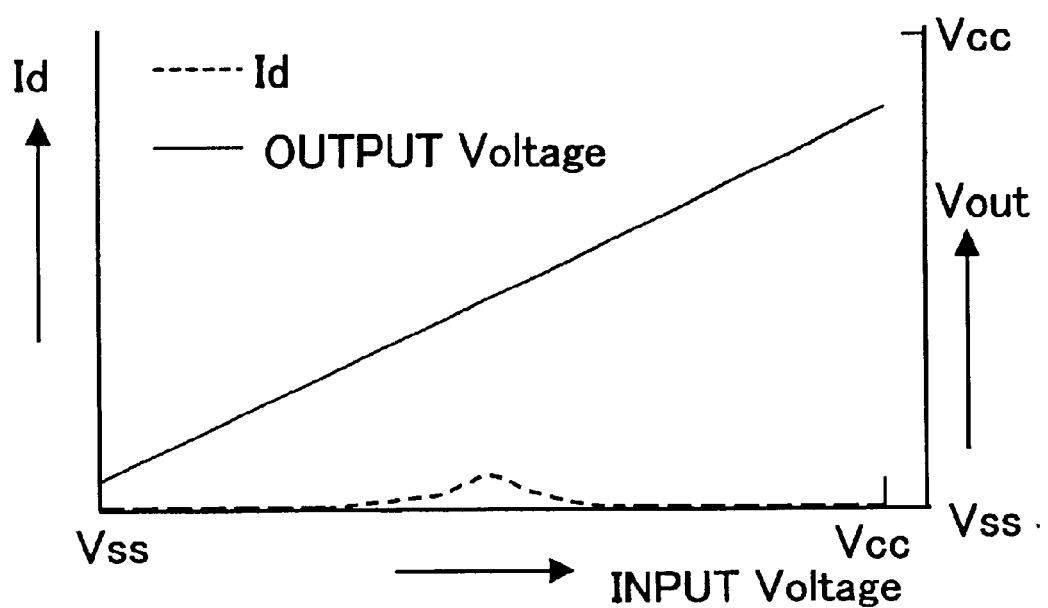
FIG. 5 is a graph illustrating the relationship between input voltage versus through current "Id" and output voltage for the circuit of FIG. 4.
Figure 6:
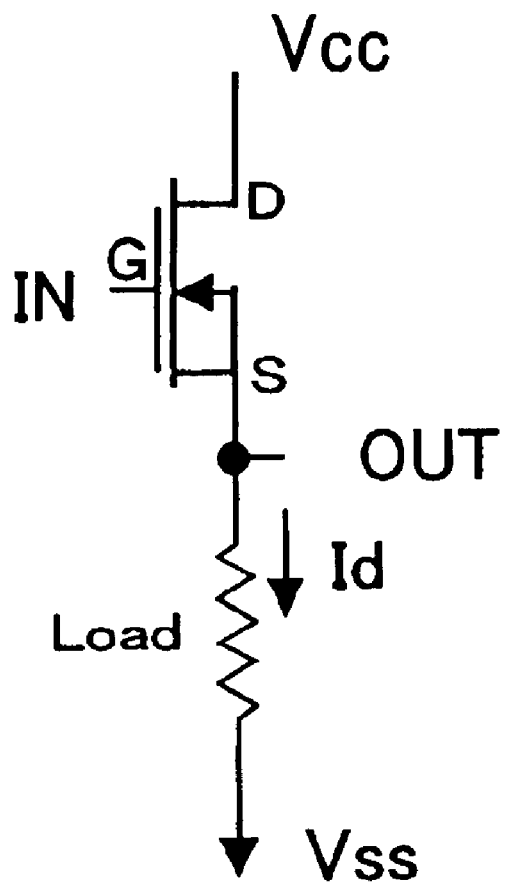
FIG. 6 shows a prior art source follower circuit having a single MOSFET and a load.
Figure 7:
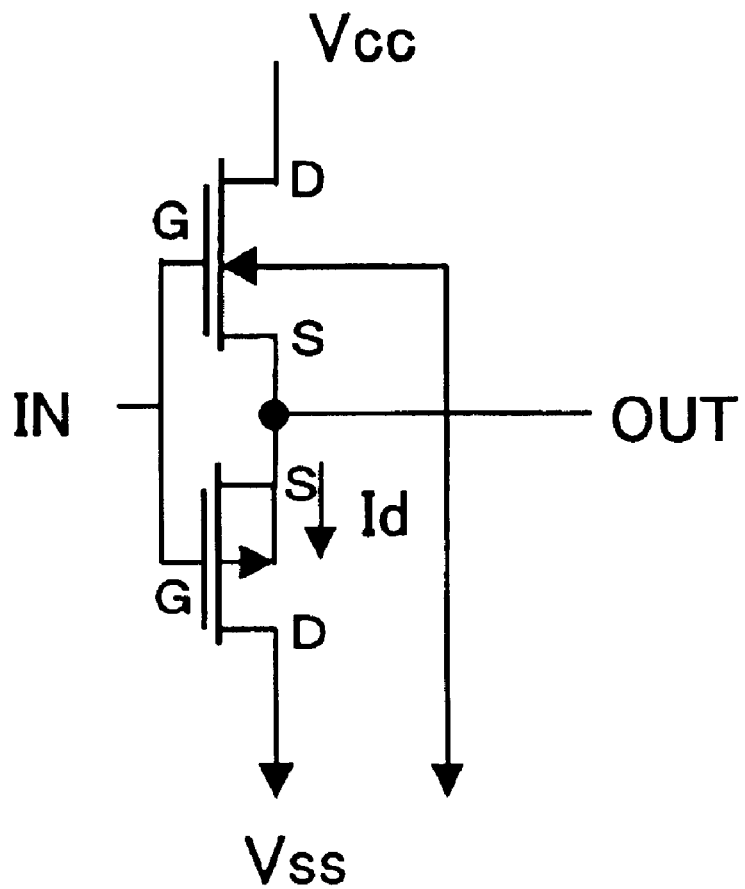
FIG. 7 shows a prior art complementary source follower circuit for an LSI.
Figure 8:
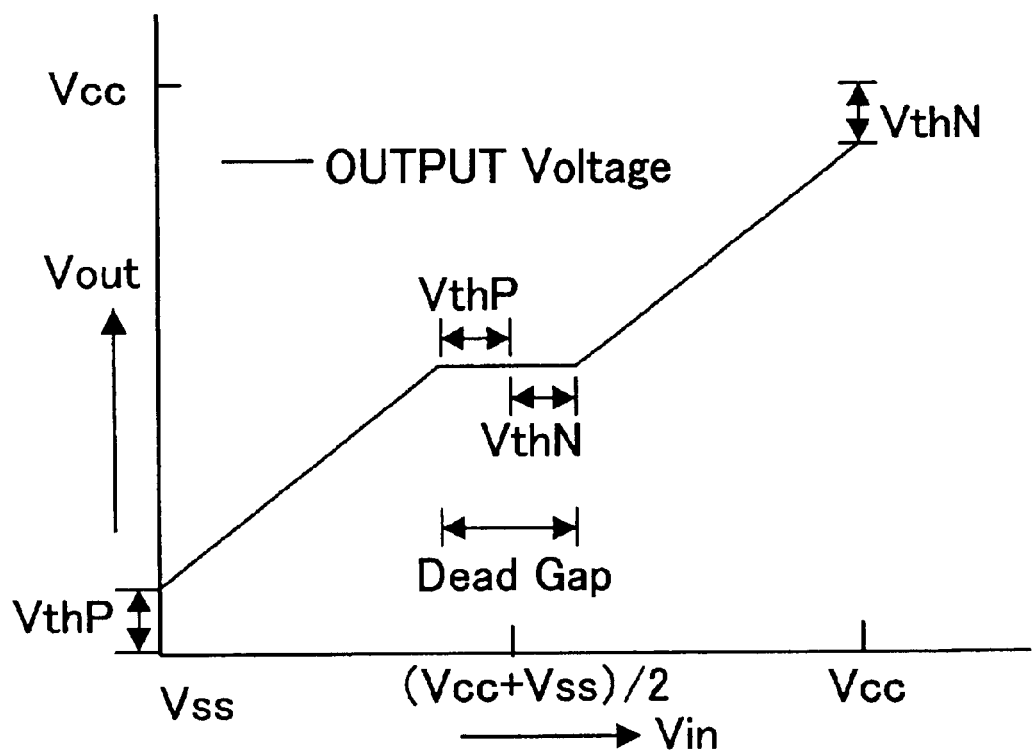
FIG. 8 is a graph illustrating the dead gap and threshold voltage relationship for the circuit of FIG. 7.
Figure 9:
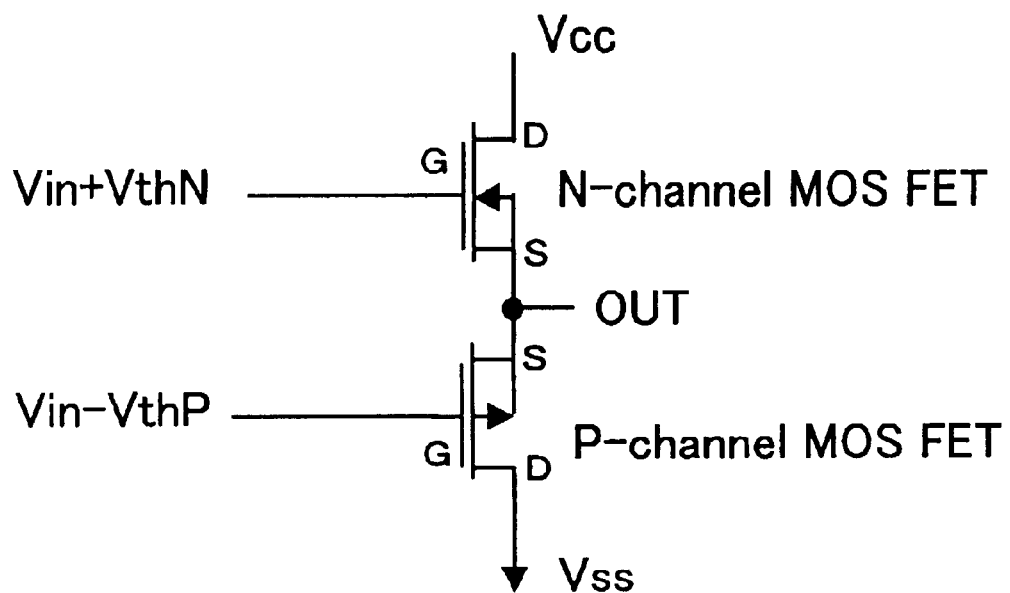
FIG. 9 shows a prior art source follower circuit that eliminates the dead gap by input voltage level shifting of the threshold voltage.
Figure 10:
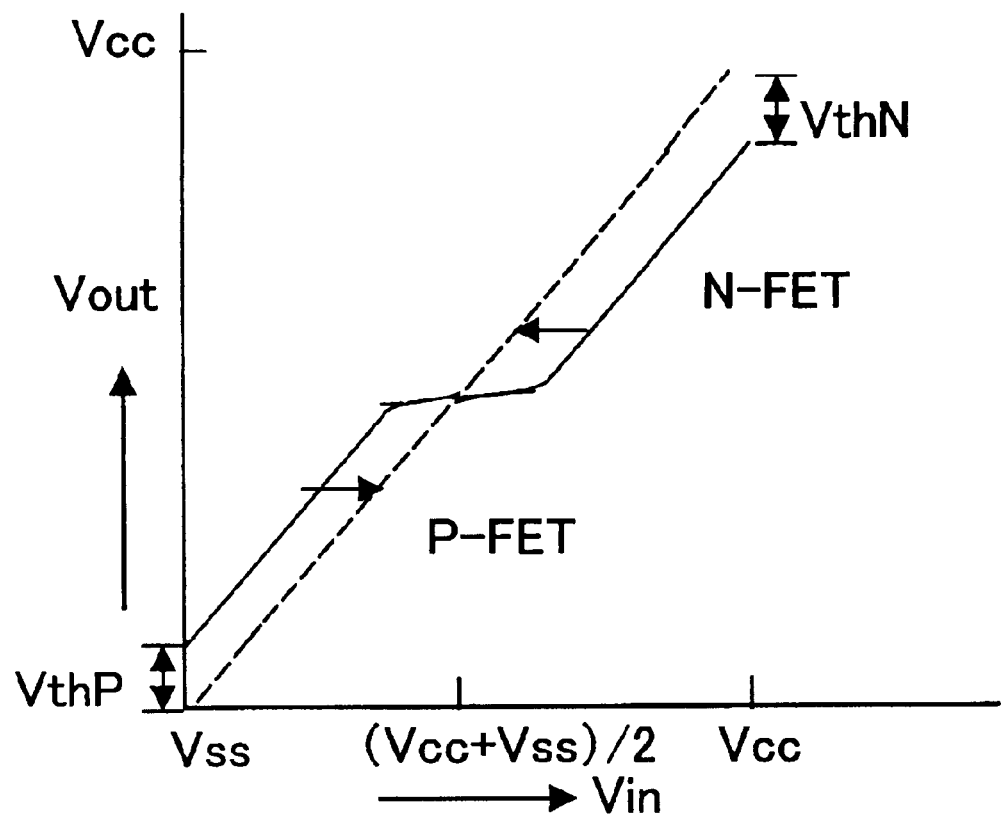
FIG. 10 is a graph illustrating the results of the input voltage level shifting of the circuit of FIG. 9.
Figure 11:
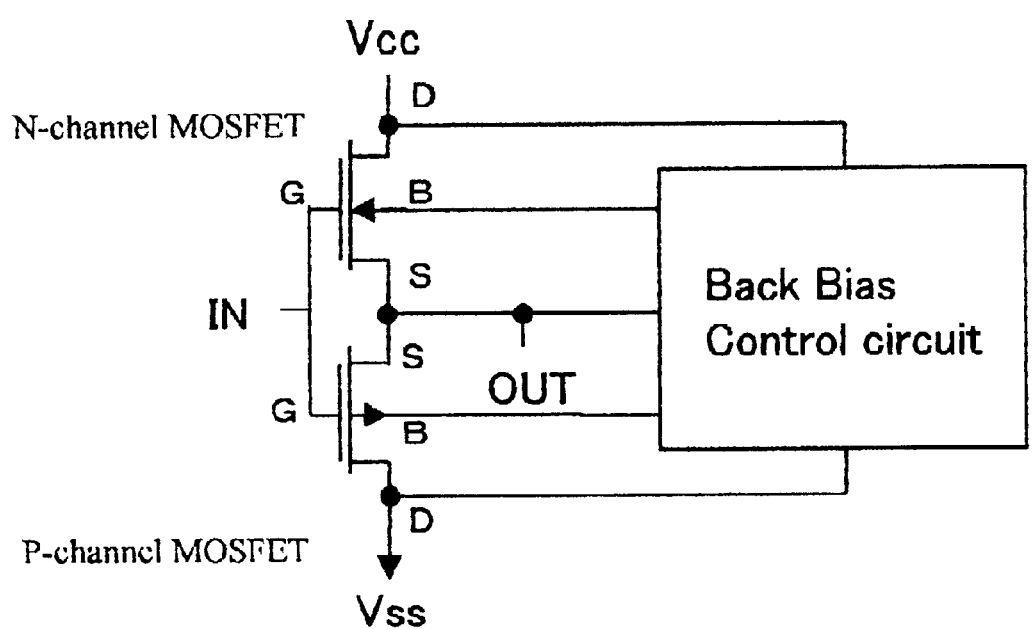
FIG. 11 shows a source follower circuit according to a certain presently preferred embodiment of this invention that eliminates the dead gap by shifting the threshold voltages of the MOSFETs.

In FIG. 11, the drain (D) terminal of NFET (N-channel field effect transistor) is connected to positive voltage Vcc and the drain (D) of PFET (P-channel field effect transistor) is connected to lower or negative voltage Vss. Each transistor has a back bias terminal connected to its body (B). The back bias terminals and the voltage at "OUT" are connected to back bias control circuit, which can independently control the threshold voltage of each transistor at different values in the active mode and in the standby mode. As is well known in the art, the threshold voltage of a transistor can be changed by changing its back bias voltage. See, for example, U.S. Pat. No. 6,275,094, FIGS. 4 and 6 of U.S. Pat. No. 6,232,827, FIG. 6 of U.S. Pat. No. 6,271,713, and the bias potential generation circuit in FIG. 1 of U.S. Pat. No. 5,461,338.

Figure 12:
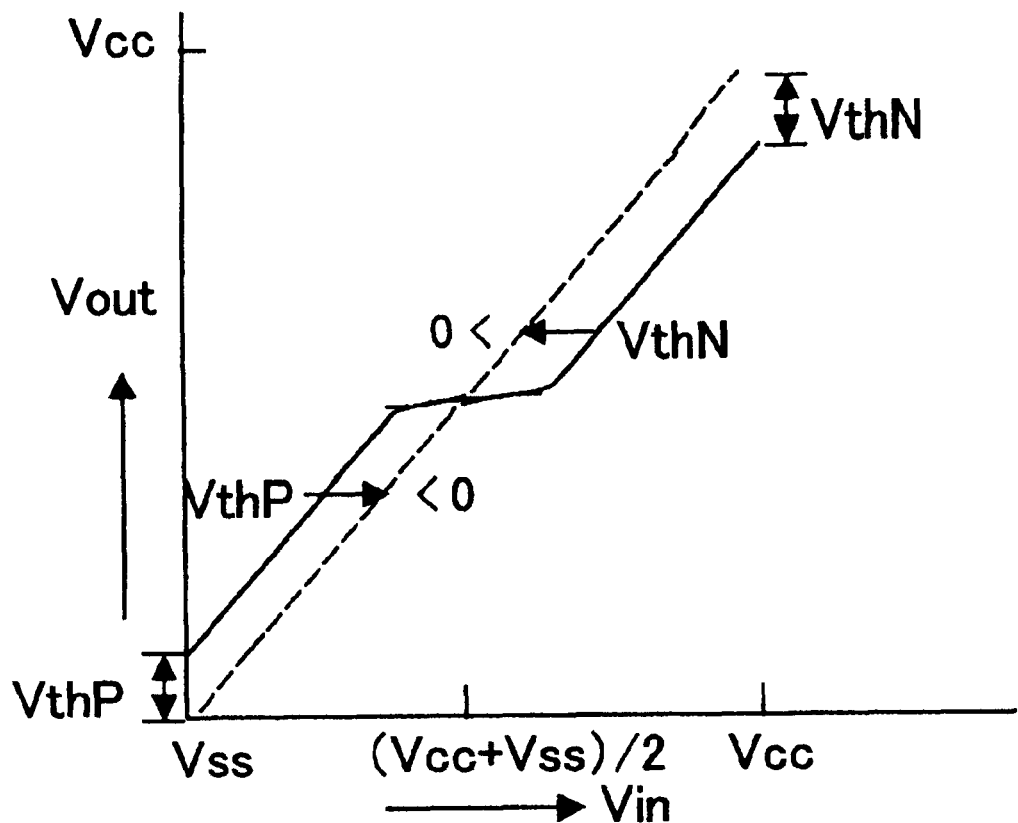
FIG. 12 is a graph illustrating the results of the threshold voltage shifting of the circuit of FIG. 11.

As shown in FIG. 12, the back bias control circuit shifts the threshold voltage of each transistor to achieve linearity and eliminate the dead gap. Normally, the threshold voltage of the NFET is shifted less than 0 volts and the threshold voltage of the PFET is shifted more than 0 volts. The crossover point is usually about (Vcc+Vss)/2.

Figure 13:
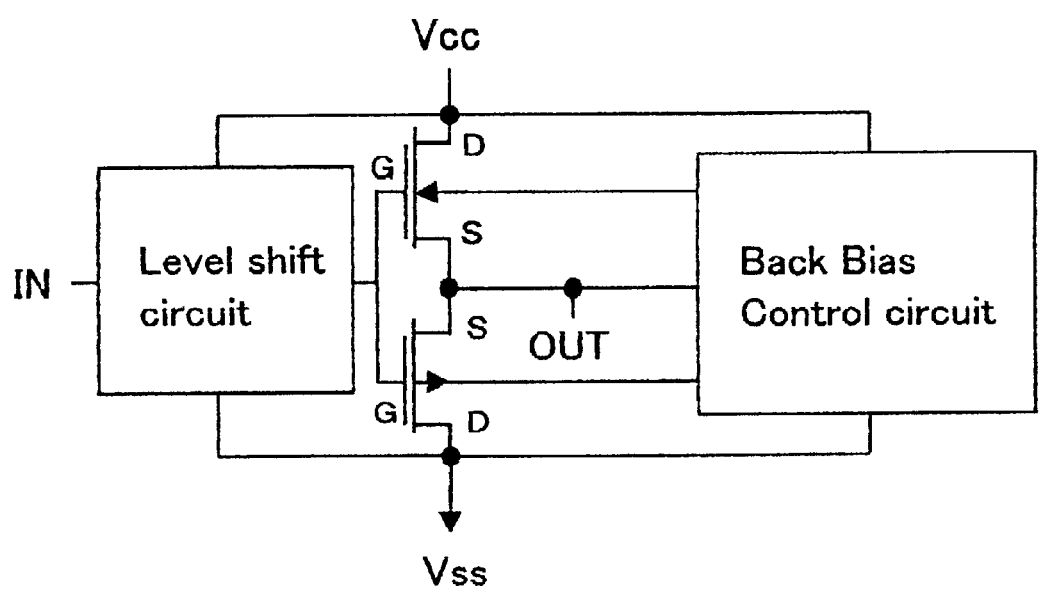
FIG. 13 shows a source follower circuit illustrating another certain presently preferred embodiment of this invention that combines both threshold voltage shifting and input voltage level shifting.
Figure 14:
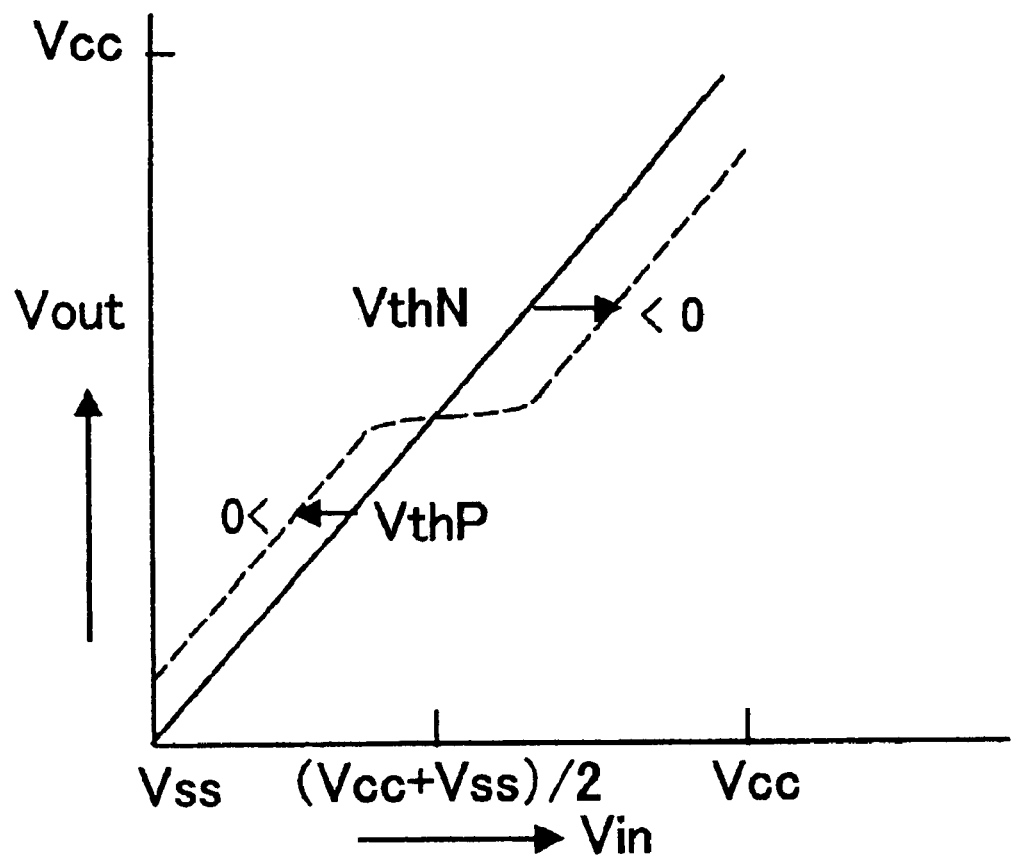
FIG. 14 is a graph illustrating the results of the threshold voltage shifting and input voltage level shifting of the circuit of FIG. 13.

In FIG. 13, a level shift circuit is also used in addition to a back bias control circuit. This embodiment can be used when the threshold voltage cannot be shifted enough to achieve linearity. While turning off the level shift circuit will re-create the dead gap so that power is not consumed in standby mode, this can also be accomplished using the back bias control circuit, which may be more effective. FIG. 14 shows how the level shift circuit and the back bias control circuit eliminate the dead gap when the source follower circuit is in active mode.

Figure 15:
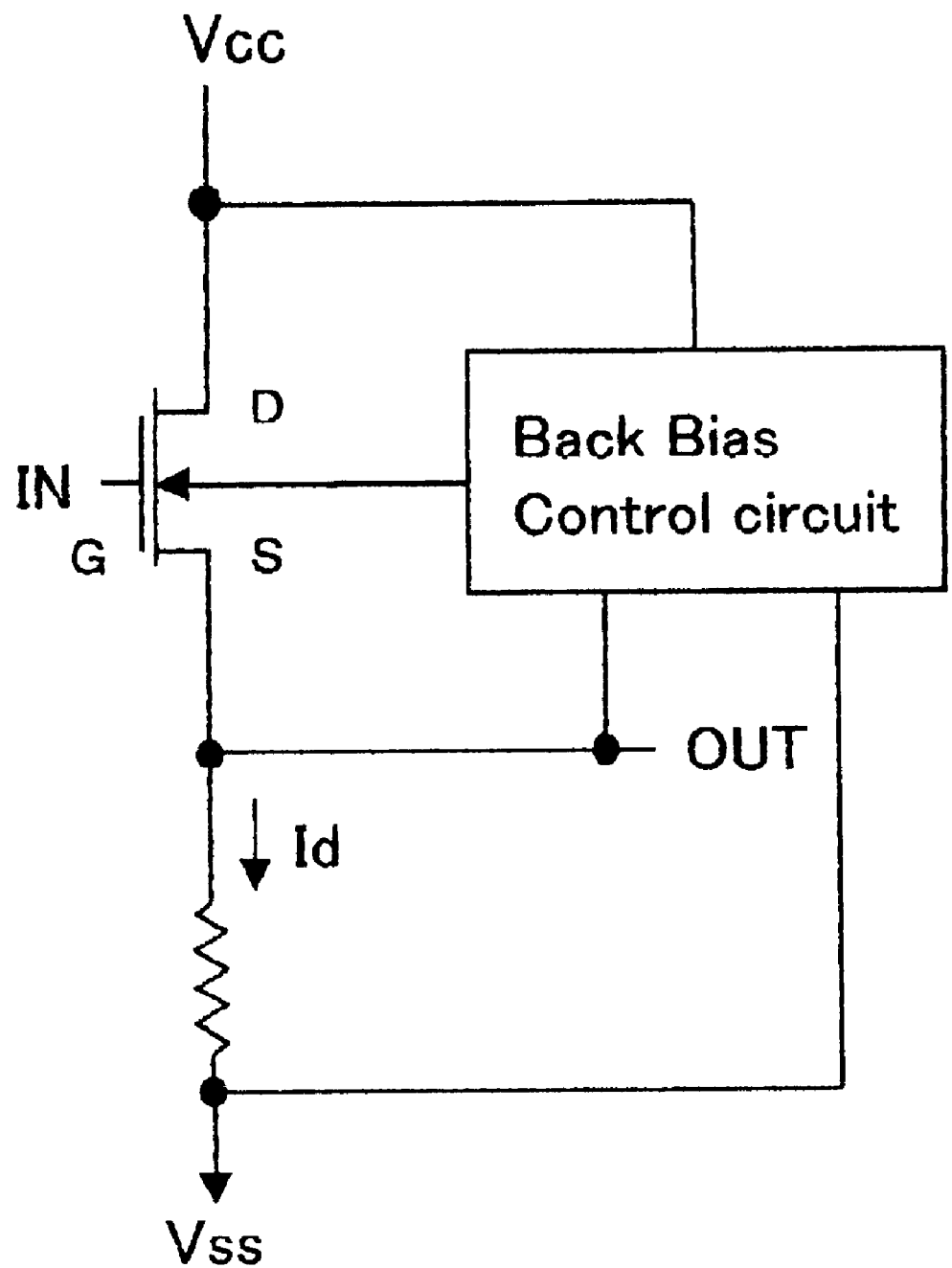
FIG. 15 shows another embodiment of a source follower circuit according to this invention having a single MOSFET and a load.

FIG. 15 shows a resistance load source follower circuit. In this embodiment, power consumption in the active mode and in the standby mode is controlled by back bias control circuit. That is, in standby mode and/or when the transistor is in an "off" state, the threshold voltage is increased so that no current flows from Vcc to Vss.

Figure 16:
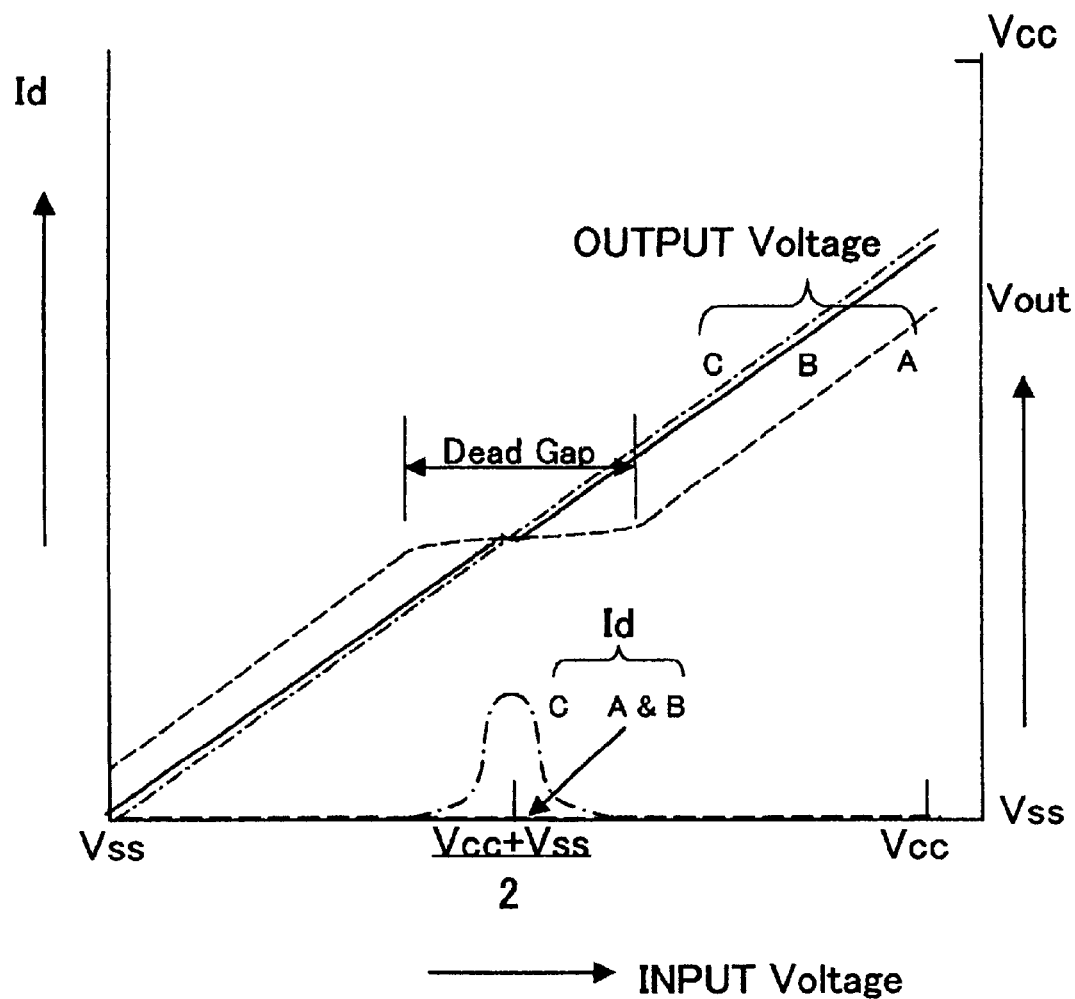
FIG. 16 is a graph that shows the relationship between input voltage, output voltage, and circuit current Id.

FIG. 16 shows the results of controlling the back bias voltage for a complementary source follower circuit according to this invention, such as that shown in FIG. 11. Curve A shows the dead gap that results when the threshold voltage of both transistors is shifted by the back bias control circuit. In this dead gap condition both transistors are "off." This condition is created by the input condition from (Vcc+Vss)/2−|VthP| to (Vcc+Vss)/2+VthN. Therefore, when the center of the input signal voltage is (Vcc+Vss)/2 no current flows. This dead gap condition is for the standby mode. The current flow conditions of the curves B and C are for the active mode. In the curve B case, both threshold voltages are zero. This means that when the input voltage is (Vcc+Vss)/2 ideally no current flows. But since there are fluctuations in the process, it is not realistic to expect that both threshold voltages will be zero and actually current will flow based on the threshold conditions of both transistors. In this condition, linearity between the input signal and the output signal is not achieved near (Vcc+Vss)/2. In curve C, current always flows near (Vcc+Vss)/2 and linearity is achieve for all input conditions. Thus, shifting the back bias voltage from curve A or B to curve C achieves linearity and shifting from curve C to curve A or B achieves non-linearity. To eliminate the dead gap in active mode and achieve linearity the back bias voltage shifts from curve A to curve B or C. When in standby mode, the dead gap is created by shifting from curve A or B to curve C.

Figure 17:
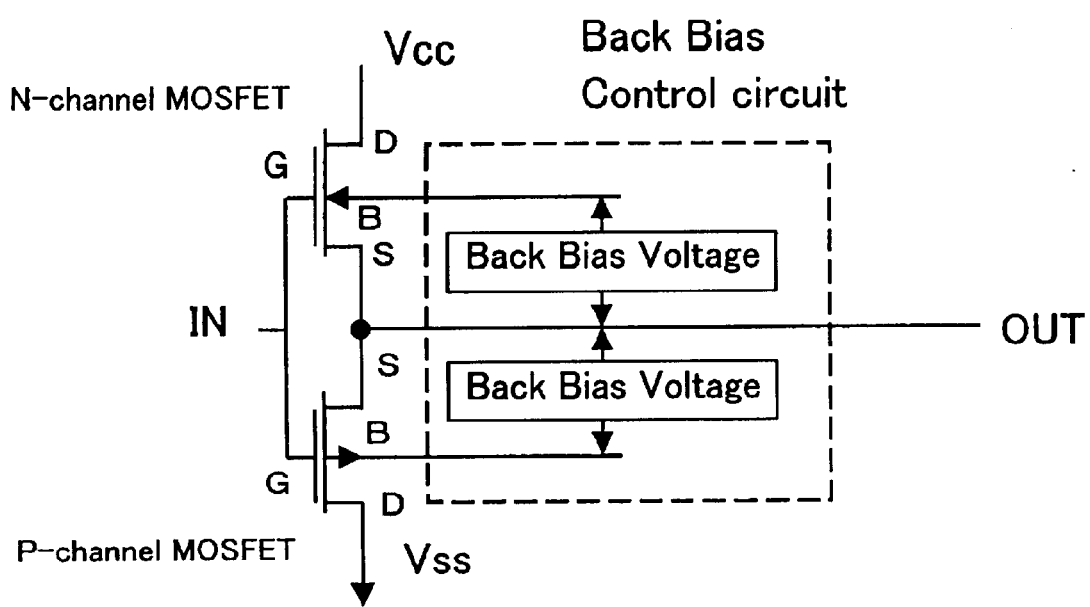
FIG. 17 shows a source follower circuit according to this invention where a back bias voltage can shift the threshold voltage of each transistor.
Figure 18:
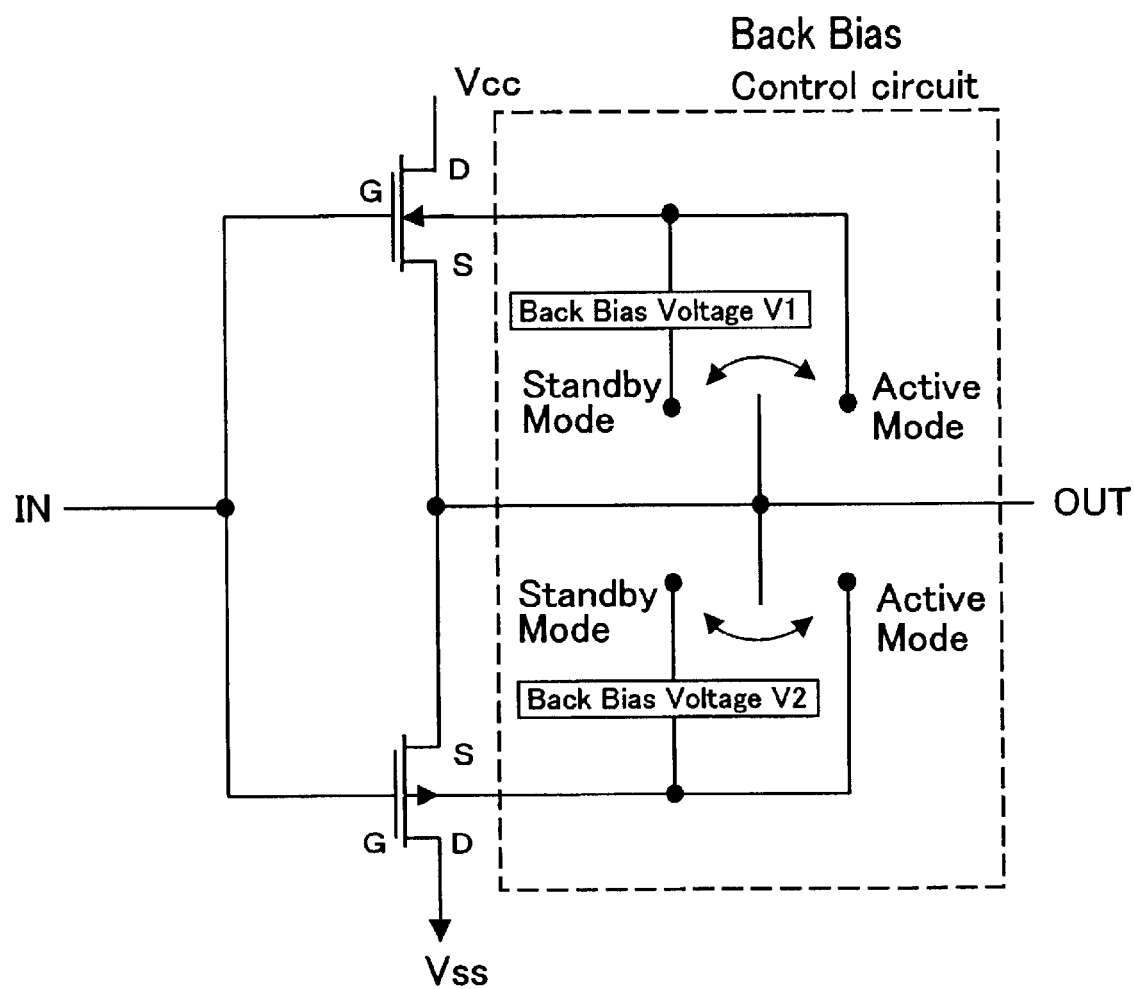
FIG. 18 shows a source follower circuit according to this invention where the back bias voltage can be switched between standby mode and active mode for each transistor.
Figure 19:
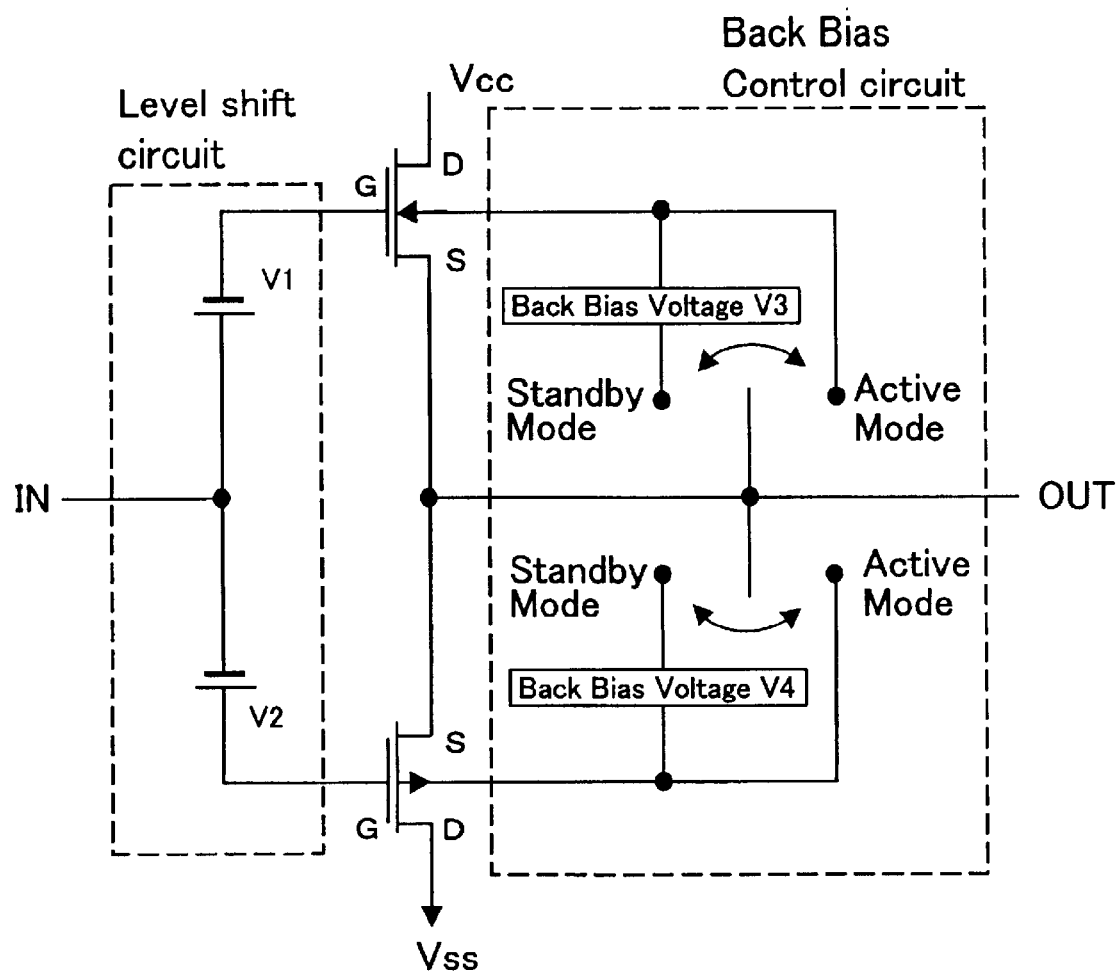
FIG. 19 is similar to FIG. 18, but also includes a level shift circuit.
Figure 20:
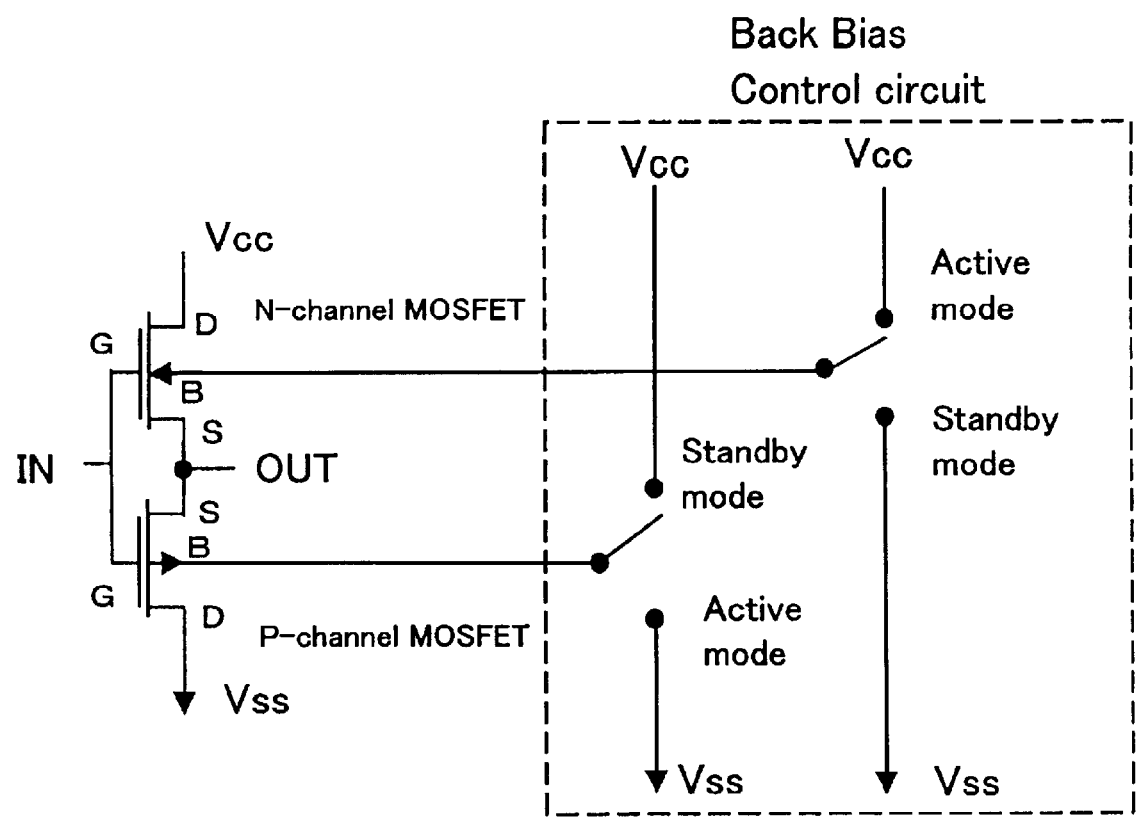
FIG. 20 shows a source follower circuit according to this invention where the back bias voltage can be independently switched between active mode and standby mode for each transistor.

FIG. 17 is similar to FIG. 11 but shows an example of a connection from the back bias circuit to the output voltage. FIG. 18 more explicitly shows the circuitry for shifting between active mode and standby mode. FIG. 19 combines the features of FIGS. 13 and 18, showing both a level shift circuit and the circuitry shown in FIG. 18. FIG. 20 is similar to FIG. 18, but shows an alternative circuit design.

Figure 21:
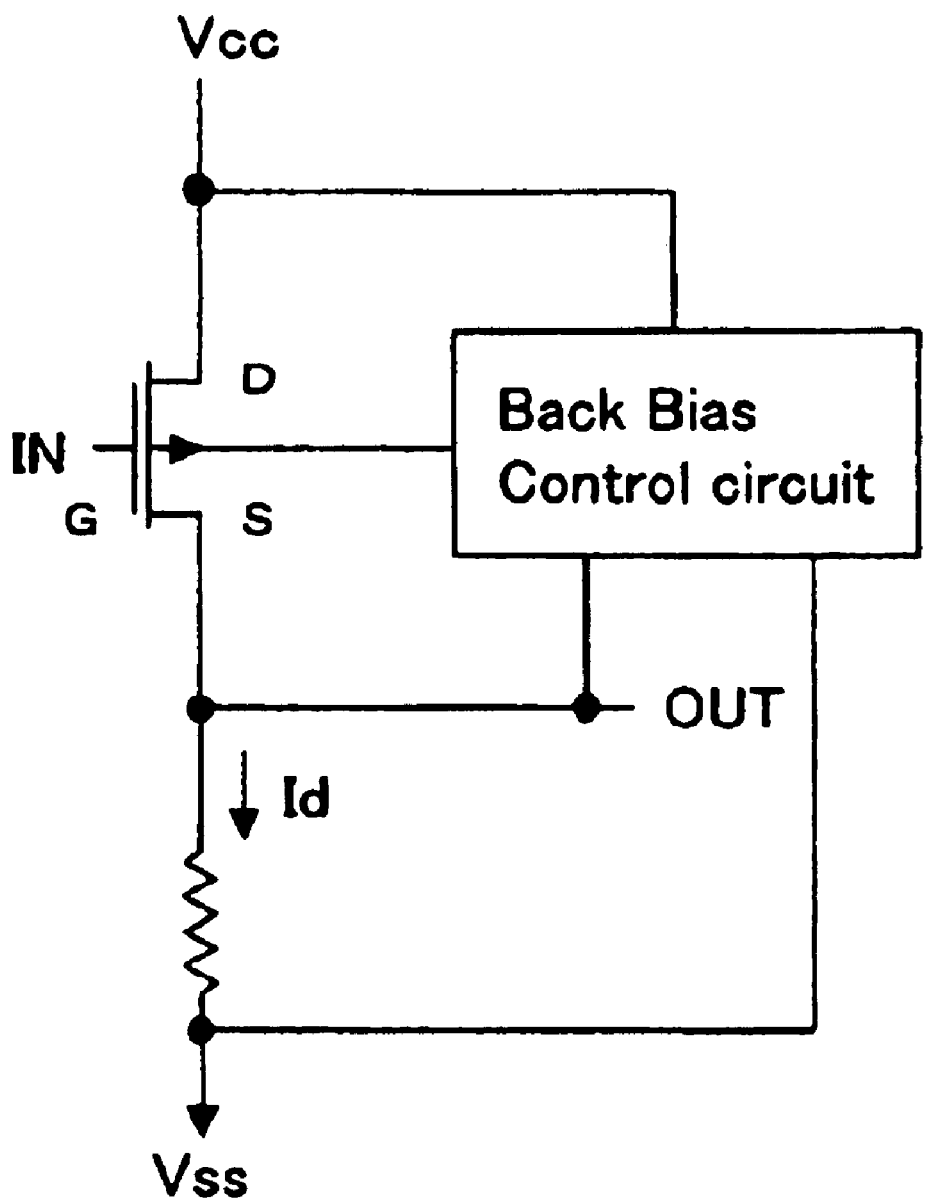
FIG. 21 shows a P channel transistor resistance load source follower circuit according to this invention.
Figure 22:
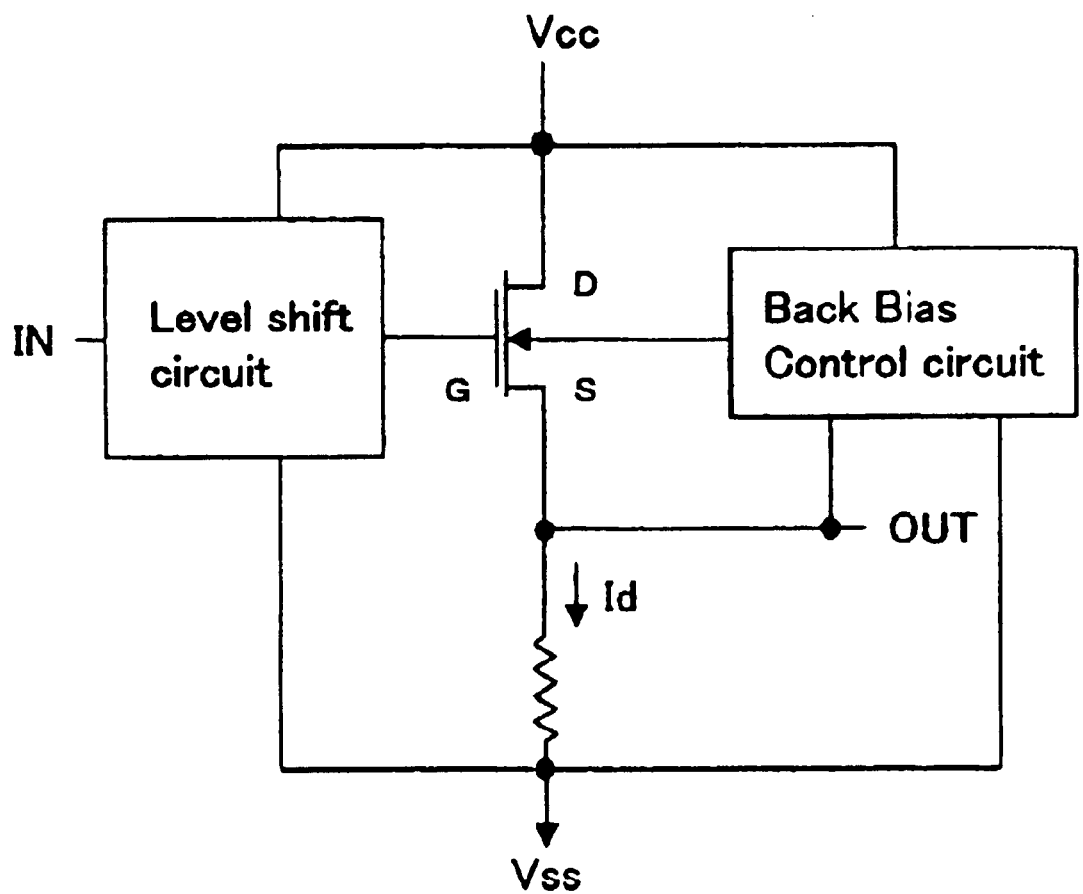
FIG. 22 shows a P channel transistor resistance load source follower circuit with a level circuit according to this invention.

FIG. 21 is similar to FIG. 15 but shows a P channel transistor, as indicated by the direction of the arrow on the line going from the transistor to the back bias control circuit. FIG. 22 is also similar to FIG. 15, but adds the level shift circuit shown in FIG. 13.

The present invention is also useful when implemented utilizing SOI technology. Indeed, any technology that allows independent control of the threshold voltages of transistors can be utilized with the present invention. As the drawings illustrate, in this invention there is no control signal line connection (i.e., a connection that carries information) from a body terminal to a source terminal, from a body terminal to a drain terminal, or from a back bias circuit to a drain terminal. However, there can be a power connection from a back bias circuit to a drain terminal to supply voltage to the back bias circuit.

While the invention has been particularly shown and described with reference to preferred embodiments, it will be understood by those skilled in the art that various changes in form and detail may be made therein without departing from the spirit and scope of the invention.

EXAMPLE

A complementary source follower circuit similar to that of FIG. 11 could have an NFET with a threshold voltage of 0.2 volts and a PFET with a threshold voltage of −0.2 volts, where Vcc is 0.9 volts and Vss is −0.9 volts. The level shift circuit could shift the input voltage of the NFET by −0.3 volts and the input voltage of the PFET by 0.3 volts to eliminate the dead gap. Then, in standby mode, the back bias control circuit could shift the threshold voltage of the NFET by 0.3 volts and the threshold voltage of the PFET by −0.3 volts to re-create a dead gap and reduce Id to zero.

I claim:

1. A resistance load source follower circuit comprising
   (A) a transistor on a substrate, having a body connected to a body terminal, a gate connected to a gate terminal, a source connected to a source terminal, and a drain connected to a drain terminal, where there is no connection from a body terminal to a source terminal or from a body terminal to a drain terminal;
   (B) a connection from said gate terminal to an input terminal;
   (C) a resistance load having a first terminal and a second terminal;
   (D) a connection from said source terminal and from said first terminal to an output terminal;
   (E) a power supply having two terminals;
   (F) a connection from the drain terminal of said transistor to one terminal of said power supply and a connection from said second terminal to the other terminal of said power supply; and
   (G) a connection from said body terminal to a back bias control circuit, where said back bias control circuit independently controls the threshold voltage of said transistor to reduce power usage by said circuit, and a connection from said back bias circuit to said output terminal, and there is no connection from said back bias control circuit to a drain terminal.

2. A resistance load source follower circuit according to claim 1 wherein said transistor is an N-channel transistor.

3. A resistance load source follower circuit according to claim 1 wherein said transistor is a P-channel transistor.

4. A resistance load source follower circuit according to claim 1 wherein said substrate is an SOI.

5. A resistance load source follower circuit according to claim 1 wherein said substrate is a single crystal silicon.

6. A resistance load source follower circuit according to claim 5 wherein said substrate is undoped.

7. A resistance load source follower circuit according to claim 1 wherein at least some of the signals to said input terminal are analog.

8. A resistance load source follower circuit according to claim 1 that includes a level voltage shift circuit for shifting the input voltage to said transistor.

9. A resistance load source follower circuit according to claim 1 that has an active mode and a standby mode, wherein said back bias control circuit sets the threshold voltage of said transistor at different values in said active mode and in said standby mode.

10. An LSI having thereon at least one resistance load source follower circuit according to claim 1.

11. An LSI according to claim 10 wherein at least one resistance load source follower circuit functions as an output buffer.

12. An LSI according to claim 10 wherein at least one resistance load source follower circuit functions as a voltage regulator.

13. A resistance load source follower circuit according to claim 1 wherein said back bias control circuit alternatively applies the voltages of Vss or Vcc to said body terminal.

14. A resistance load source follower circuit comprising
   (A) a P-channel transistor on a substrate, having a body connected to a body terminal, a gate connected to a gate terminal, a source connected to a source terminal, and a drain connected to a drain terminal, where there is no connection from a body terminal to a source terminal or from a body terminal to a drain terminal;
   (B) a connection from said gate terminal to an input terminal;
   (C) a resistance load having a first terminal and a second terminal;
   (D) a connection from said source terminal and from said first terminal to an output terminal;
   (E) a power supply having two terminals;
   (F) a connection from the drain terminal of said transistor to one terminal of said power supply and a connection from said second terminal to the other terminal of said power supply; and
   (G) a connection from said body terminal to a back bias control circuit, where said back bias control circuit independently controls the threshold voltage of said transistor to reduce power usage by said circuit, and a connection from said back bias circuit to said output terminal, and there is no connection from said back bias control circuit to a drain terminal.

15. A resistance load source follower circuit according to claim 14 wherein said substrate is an SOI.

16. A resistance load source follower circuit according to claim 14 wherein said substrate is single crystal silicon.

17. A source follower circuit comprising
   (A) an N-channel transistor on a substrate, having a body connected to a body terminal, a gate connected to a gate terminal, a source connected to a source terminal, and a drain connected to a drain terminal, where there is no connection from a body terminal to a source terminal or from a body terminal to a drain terminal;
   (B) a connection from said gate terminal to an input terminal;
   (C) a resistance load having a first terminal and a second terminal;
   (D) a connection from said source terminal and from said first terminal to an output terminal;
   (E) a power supply having two terminals;
   (F) a connection from the drain terminal of said transistor to one terminal of said power supply and a connection from said second terminal to the other terminal of said power supply; and
   (G) a connection from said body terminal to a back bias control circuit, where said back bias control circuit independently controls the threshold voltage of said transistor to reduce power usage by said circuit, and a connection from said back bias circuit to said output terminal, and there is no connection from said back bias control circuit to a drain terminal.

18. A resistance load source follower circuit according to claim 17 wherein said substrate is an SOI.

19. A resistance load source follower circuit according to claim 17 wherein said substrate is a single crystal silicon.

* * * * *